(12) United States Patent
Huang et al.

(10) Patent No.: US 8,842,479 B2
(45) Date of Patent: Sep. 23, 2014

(54) LOW VOLTAGE PROGRAMMING IN NAND FLASH WITH TWO STAGE SOURCE SIDE BIAS

(75) Inventors: Jyun-Siang Huang, Chiayi (TW); Wen-Jer Tsai, Hualien (TW); Ping-Hung Tsai, Taoyuan (TW)

(73) Assignee: Macronix International Co., Ltd., Hsinchu (TW)

( * ) Notice: Subject to any disclaimer, the term of this patent is extended or adjusted under 35 U.S.C. 154(b) by 360 days.

(21) Appl. No.: 13/271,161

(22) Filed: Oct. 11, 2011

(65) Prior Publication Data

US 2013/0088920 A1   Apr. 11, 2013

(51) Int. Cl.
| | | |
|---|---|---|
| G11C 16/04 | (2006.01) | |
| G11C 16/06 | (2006.01) | |
| G11C 16/08 | (2006.01) | |
| G11C 16/10 | (2006.01) | |
| G11C 16/12 | (2006.01) | |

(52) U.S. Cl.
CPC ............ *G11C 16/10* (2013.01); *G11C 16/0483* (2013.01); *G11C 16/06* (2013.01); *G11C 16/08* (2013.01); *G11C 16/12* (2013.01); *G11C 16/04* (2013.01)
USPC ............ 365/185.24; 365/185.17; 365/185.18; 365/185.02

(58) Field of Classification Search
CPC .... G11C 16/0483; G11C 16/04; G11C 16/06; G11C 16/08; G11C 16/10; G11C 16/12
USPC .............. 365/185.02, 185.17, 185.18, 185.24
See application file for complete search history.

(56) References Cited

U.S. PATENT DOCUMENTS

| | | | |
|---|---|---|---|
| 7,315,474 B2 | 1/2008 | Lue | |
| 7,492,636 B2 | 2/2009 | Wu | |
| 2007/0217264 A1 | 9/2007 | Samachisa | |
| 2008/0049502 A1* | 2/2008 | Byeon et al. ............. | 365/185.05 |

(Continued)

FOREIGN PATENT DOCUMENTS

EP          2048709 A2      4/2009

OTHER PUBLICATIONS

Pending U.S. Appl. No. 12/898,979 entitled Low Voltage Programming in NAND Flash, filed Oct. 6, 2010, inventors P-H. Tsai, J-S. Huang and W-J. Tsai.

(Continued)

*Primary Examiner* — J. H. Hur
(74) *Attorney, Agent, or Firm* — Haynes Beffel & Wolfeld LLP

(57) ABSTRACT

A memory device includes a plurality of memory cells arranged in series in the semiconductor body, such as a NAND string, having a plurality of word lines. A selected memory cell is programmed by hot carrier injection. The program operation is based on metering a flow of carriers between a first semiconductor body region on a first side of the selected cell in the NAND string and a second semiconductor body region on a second side of the selected cell. A program potential higher than a hot carrier injection barrier level is applied to the selected cell, and then the drain to source voltage across the selected cell and the flow of carriers in the selected cell reach a level sufficient to support hot carrier injection, which is controlled by a combination of a switch cell adjacent the selected cell and modulation of a source side voltage applied to the NAND string.

21 Claims, 10 Drawing Sheets

(56) References Cited

U.S. PATENT DOCUMENTS

| | | |
|---|---|---|
| 2008/0089131 A1 | 4/2008 | Lee |
| 2008/0151627 A1* | 6/2008 | Lee et al. .............. 365/185.15 |
| 2008/0151628 A1* | 6/2008 | Lee et al. .............. 365/185.15 |
| 2008/0186776 A1* | 8/2008 | Kim et al. .............. 365/185.23 |
| 2009/0027967 A1 | 1/2009 | Lee |
| 2009/0046506 A1 | 2/2009 | Lue et al. |
| 2009/0067248 A1 | 3/2009 | Lee |
| 2009/0086542 A1* | 4/2009 | Lee et al. .............. 365/185.17 |
| 2009/0109762 A1 | 4/2009 | Huang et al. |
| 2011/0305088 A1 | 12/2011 | Huang et al. |

OTHER PUBLICATIONS

Suh et al., "A 3.3 V 32 Mb NAND Flash Memory with Incremental Step Pulse Programming Scheme," IEEE Journal of Solid-State Circuits, vol. 30, No. 11, Nov. 1995, pp. 1149-1156.

* cited by examiner

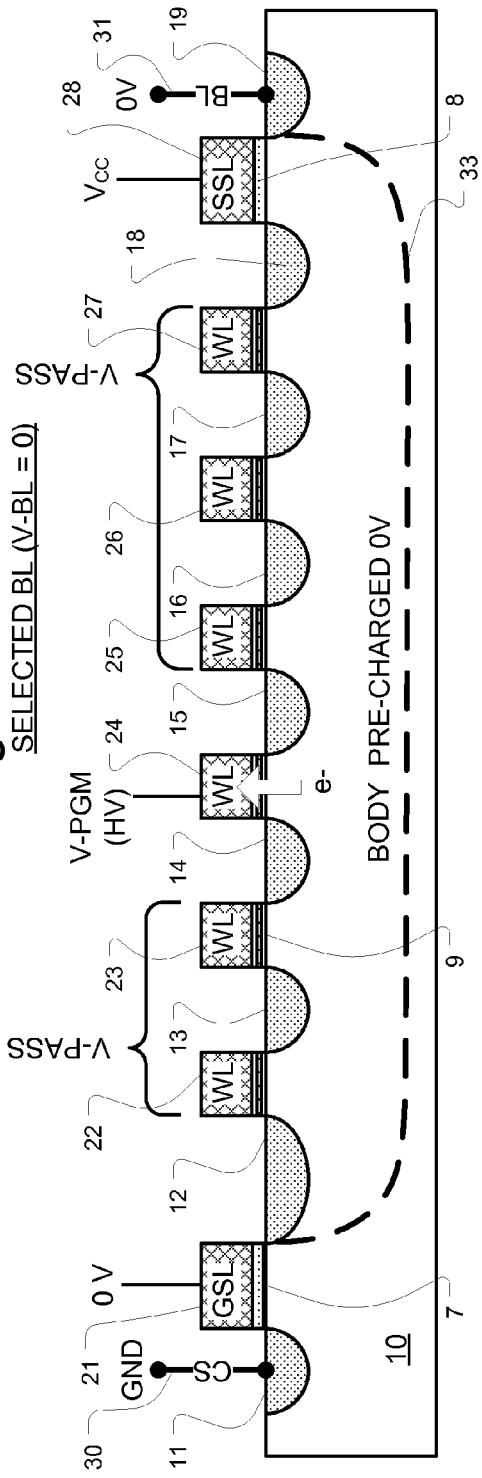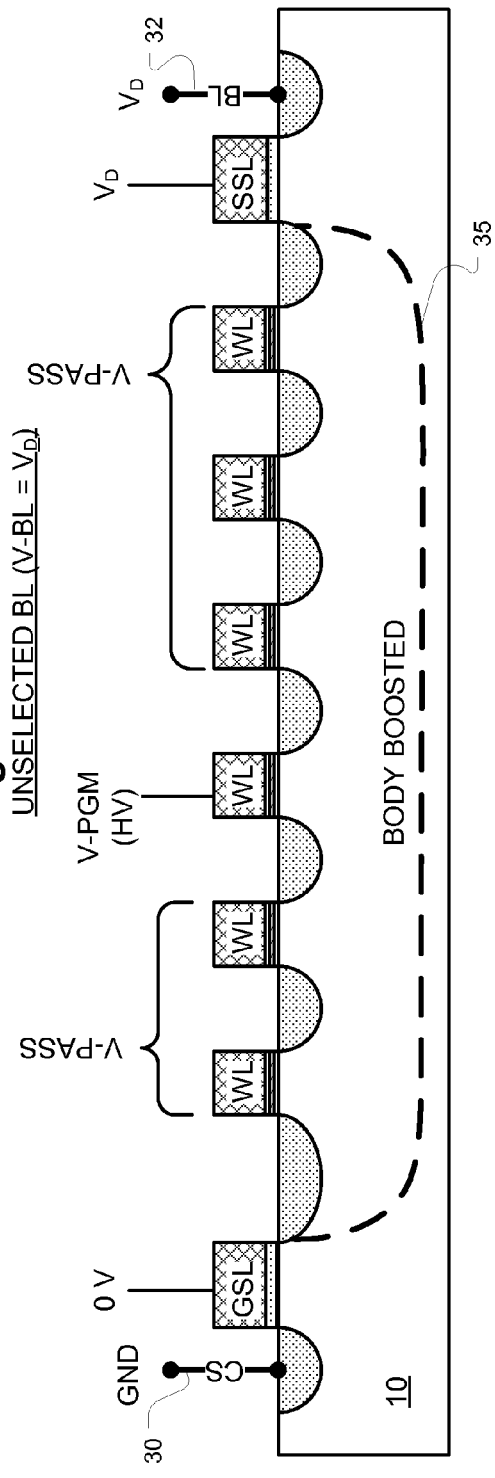

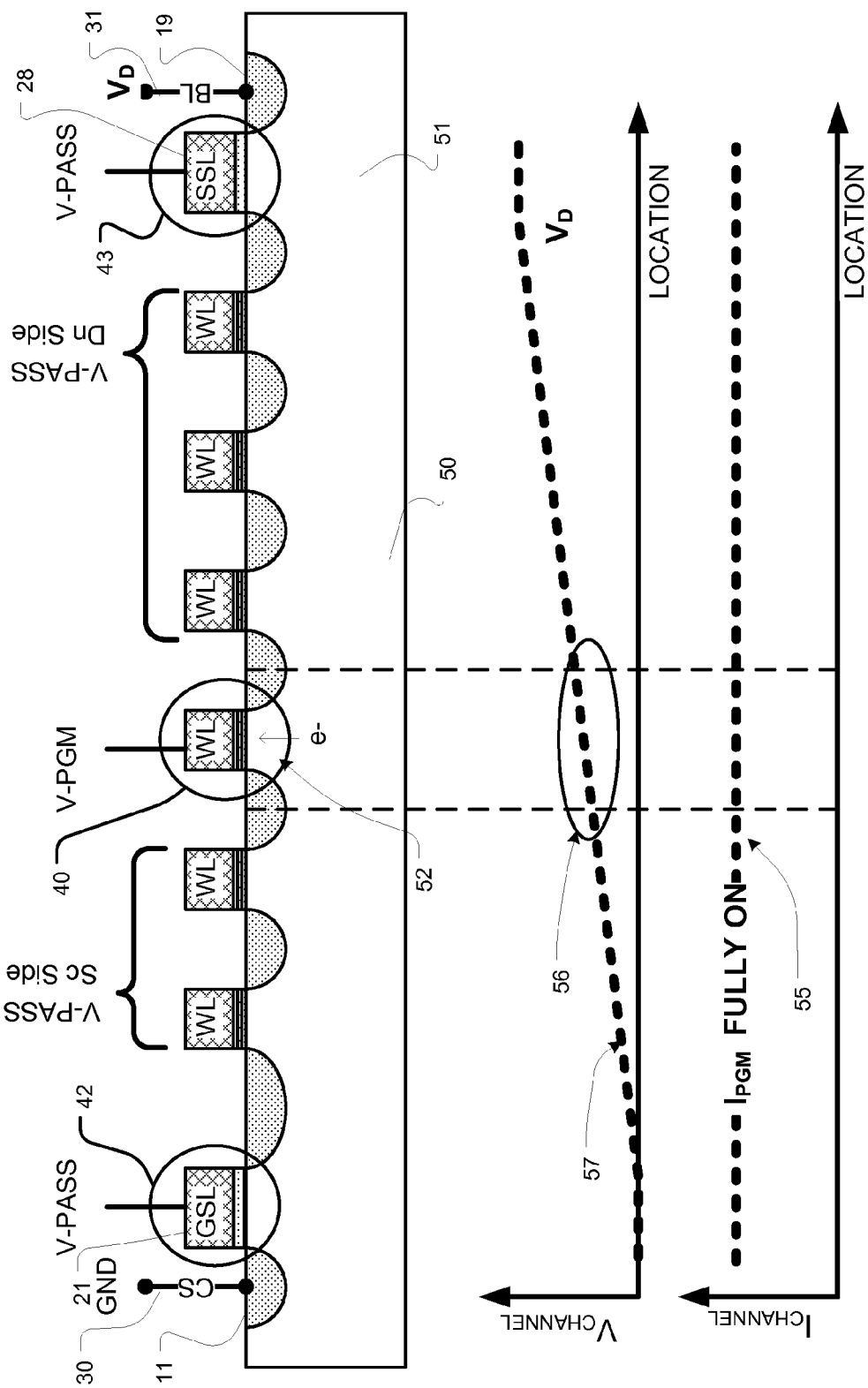
Fig. 2 – PRIOR ART

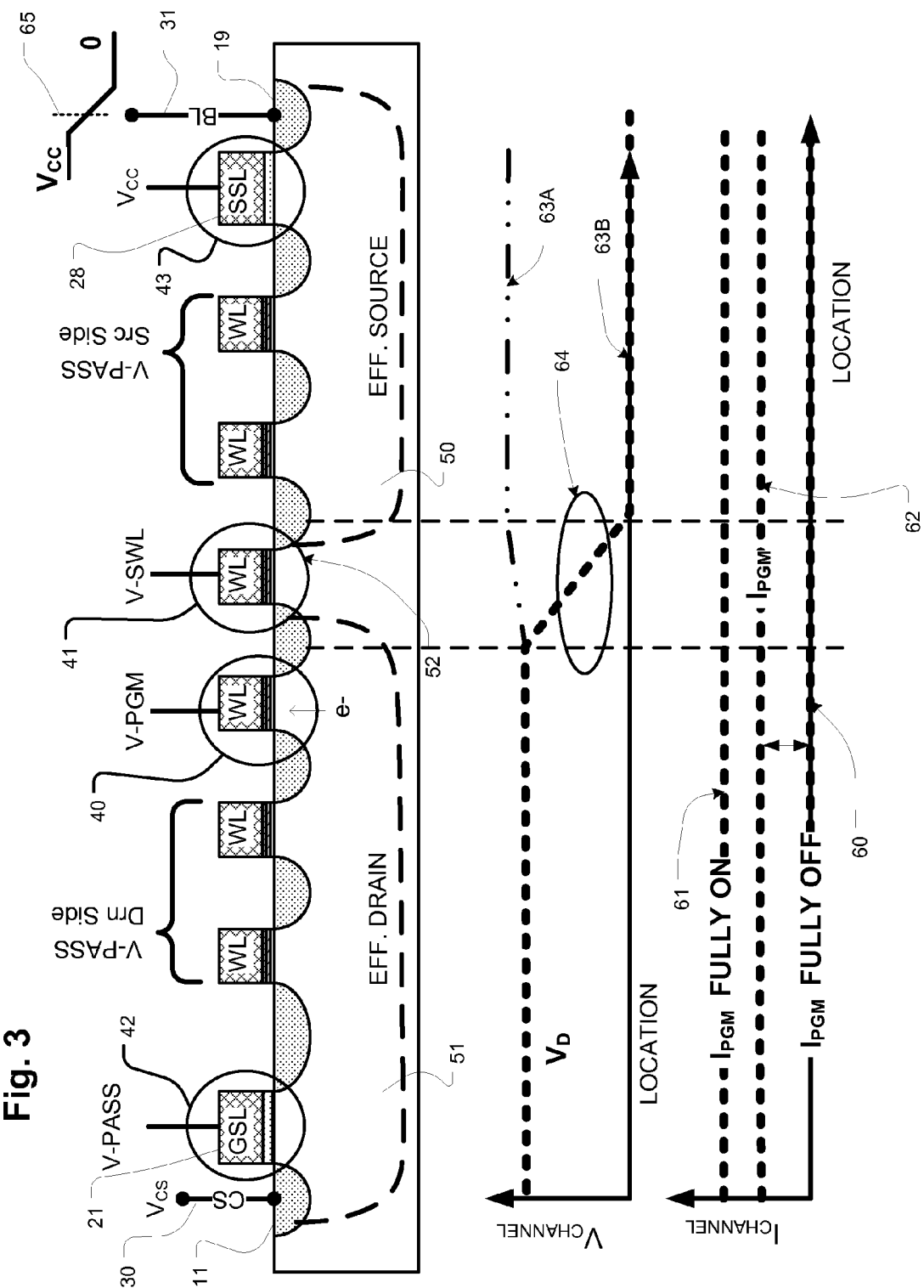

LOW VOLTAGE PROGRAMMING IN NAND FLASH WITH TWO STAGE SOURCE SIDE BIAS

REFERENCE TO RELATED APPLICATION

The present application is related to commonly owned, and co-pending U.S. patent application Ser. No.: 12/898,979; entitled LOW VOLTAGE PROGRAMMING IN NAND FLASH, filed on 6 Oct. 2010, Ping-Hung TSAI, Jyun-Siang HUANG and Wen-Jer TSAI; and to commonly owned, and co-pending U.S. patent application Ser. No. 12/797,994, entitled HOT CARRIER PROGRAMMING IN NAND FLASH, filed on 10 Jun. 2010, invented by Jyun-Siang HUANG and Wen-Jer TSAI, all of which are incorporated by reference as if fully set forth herein.

BACKGROUND OF THE INVENTION

1. Field of the Invention

The present invention relates to flash memory technology, and more particularly to flash memory suitable for low voltage program and erase in a NAND configuration.

2. Description of Related Art

Flash memory is a class of non-volatile integrated circuit memory technology. Traditional flash memory employs floating gate memory cells. As the density increases in memory devices, and the floating gate memory cells get closer and closer together, interference between the charge stored in adjacent floating gates becomes a problem. This is limiting the ability to increase the density of flash memory based on floating gate memory cells. Another type of memory cell used for flash memory can be referred to as a charge trapping memory cell, which uses a dielectric charge trapping layer in place of the floating gate. Charge trapping memory cells use dielectric charge trapping material that does not cause cell-to-cell interference like that encountered with floating gate technology, and is expected to be applied for higher density flash memory.

The typical flash memory cell consists of a field effect transistor FET structure having a source and drain separated by a channel, and a gate separated from the channel by a charge storage structure including a tunnel dielectric layer, the charge storage layer (floating gate or dielectric), and a blocking dielectric layer. According to the early conventional charge trapping memory designs referred to as SONOS devices, the source, drain and channel are formed in a silicon substrate (S), the tunnel dielectric layer is formed of silicon oxide (O), the charge storage layer is formed of silicon nitride (N), the blocking dielectric layer is formed of silicon oxide (O), and the gate comprises polysilicon (S).

Flash memory devices generally are implemented using NAND or NOR architectures, although others are known, including AND architectures. The NAND architecture is popular for its high density and high speed when applied to data storage applications. The NOR architecture is better suited to other applications, such as code storage, where random byte access is important. In a NAND architecture, the programming processes typically rely on Fowler-Nordheim (FN) tunneling that require high voltages, such as on the order of 20 volts, and require high voltage transistors to handle them. The addition of high voltage transistors on integrated circuits, in combination with transistors used for logic and other data flow, introduces complexity in the manufacturing processes. This increased complexity in turn increases the costs of the devices.

Accordingly, it is desirable to provide a new memory technology suitable for low voltage programming operations, and which is configurable in a NAND architecture.

SUMMARY

A memory device is described configured for low voltage operation that includes a plurality of memory cells arranged in series in the semiconductor body, such as can be applied for a NAND string in a NAND array, having a plurality of word lines coupled to corresponding memory cells. Control circuitry is coupled to the plurality of word lines and to the semiconductor body adapted for programming a selected target memory cell by hot carrier injection in the target cell using a controlled word line voltage, referred to as the switch voltage V-SW herein, on an adjacent cell. A source side voltage is applied to one end of the string, which is commonly ground or other voltage specified for source side biasing. The side of the selected memory cell on which the source side voltage is applied for programming is referred to herein as the "effective source side" or "effective source." A drain side voltage $V_D$ is applied to the other end of the string, which can be a supply potential often referred to in the art as $V_{DD}$ or $V_{CC}$, or other voltage specified for drain side biasing. The side of the selected memory cell on which the drain side voltage is applied for programming is referred to herein as the "effective drain side" or "effective drain." To control conductance of the switching cell, V-SW sets a bias condition in the body adjacent the target cell that establishes a condition supporting the coincidence of a sufficient heating field (drain to source voltage) and sufficient channel current in the target cell during at least a portion of a program interval in which a program voltage is applied to the target cell, inducing hot carrier injection. Hot carrier injection using this process can be implemented by control circuitry which applies a program voltage to the selected word line (corresponding to the target cell) during the program interval, which applies the switch voltage V-SW to an adjacent word line on the effective source side of the selected word line, and which applies pass voltages to the other word lines.

The selected word line is biased during the program interval by a program voltage which is sufficient to overcome the channel hot carrier injection barrier level. However, this program voltage can be significantly lower than is required for typical Fowler Nordheim programming. The other word lines corresponding with the plurality of memory cells receive a pass voltage which is lower than the program voltage in order to inhibit disturbance of the other cells. The switching voltage during the program interval is likewise lower than the program voltage to inhibit disturbance of the switching cell.

For a NAND string embodiment, a first switch (ground select switch or bottom bit line select switch) is provided on a first end of the plurality of transistors, and a second switch (string select switch or top bit line select switch) is provided on a second end of the plurality of transistors. In this embodiment, the control circuitry operates to turn on one of the first switch and the second switch on the drain side during the program interval, while turning off the other switch on the source side during an initial portion of the program interval during which source side boosting occurs, and then turning on the switch on the source side to enable current flow in the semiconductor body. The switch on the drain side can receive a gate voltage via a select line (e.g., string select lines SSL and ground select lines GSL), while the bit line or reference line to which the switch is connected is set initially at a voltage less than a threshold below, or more than the gate voltage to hold the switch transistor off, and then, subsequently, the bit line or reference line voltage is dropped more than a threshold below the gate voltage to a source side potential to enable current flow.

Select lines (e.g., string select lines SSL and ground select lines GSL) parallel to the plurality of word lines can be coupled to the first and second switches. When the selected memory cell is adjacent one of the select lines, then the switch voltage V-SW can be applied to the switch, instead of to a memory cell. Alternatively, a dummy word line may be added to the strings, which are operated to receive V-SW for programming the first or last cell in the NAND string.

In a second plurality of memory cells coupled to the same plurality of word lines, such as a parallel NAND string on an unselected bit line, the control circuitry can operate to inhibit or prevent hot carrier injection in unselected strings.

A method for inducing hot carrier injection for programming a selected cell in a NAND string is described as based on metering a flow of carriers and a heating field using V-SW adjacent the selected cell. A program potential higher than a hot carrier injection barrier level is applied to the selected target cell, and then the drain to source voltage across the selected cell and the flow of carriers in the selected cell reach a level sufficient to support hot carrier injection.

A method for inducing hot carrier injection for programming a selected cell in a NAND string is described as based on blocking flow of carriers between a first semiconductor body region on a first side of the selected cell in the NAND string and a second semiconductor body region on a second side of the selected cell well; boosting the first semiconductor body region by capacitive coupling to a boosted voltage level during an initial portion of the program interval; and biasing the second semiconductor body region to a drain side voltage level. A program potential higher than a hot carrier injection barrier level is applied to the selected cell, and then the flow of carriers is enabled by coupling the first semiconductor body region to a source side voltage during a subsequent portion of the program interval.

A novel program scheme described here can utilize hot carrier injection to effectively reduce operation voltages. Also, the technique is not sensitive to the gate coupling ratio GCR of the memory cell. Thus, it can resolve low GCR issues that can arise as memory cells continue to scale down in size, and up in memory density. In addition, as relatively lower WL voltages can be adopted, the disturbance of unselected cells can be suppressed. Also the manufacturing process can be simplified in some embodiments, since high voltage devices needed to support more traditional FN operations can be eliminated, or be implemented with less stringent specifications.

Other aspects and advantages of the present invention can be seen on review of the drawings, the detailed description and the claims which follow.

BRIEF DESCRIPTION OF THE DRAWINGS

FIGS. 1A and 1B are simplified cross-sectional views of a selected NAND string and an unselected NAND string biased according to prior art FN tunneling programming techniques.

FIG. 2 is a simplified cross-sectional view of a selected NAND string along with graphs of channel current and channel voltage, showing problems associated with prior art attempts to induce hot carrier injection programming in NAND strings.

FIG. 3 is a simplified cross-sectional view of a selected NAND string along with graphs of channel current and channel voltage versus location, showing bias conditions for inducing hot carrier injection programming in NAND strings as described herein.

DETAILED DESCRIPTION

Figure 4:
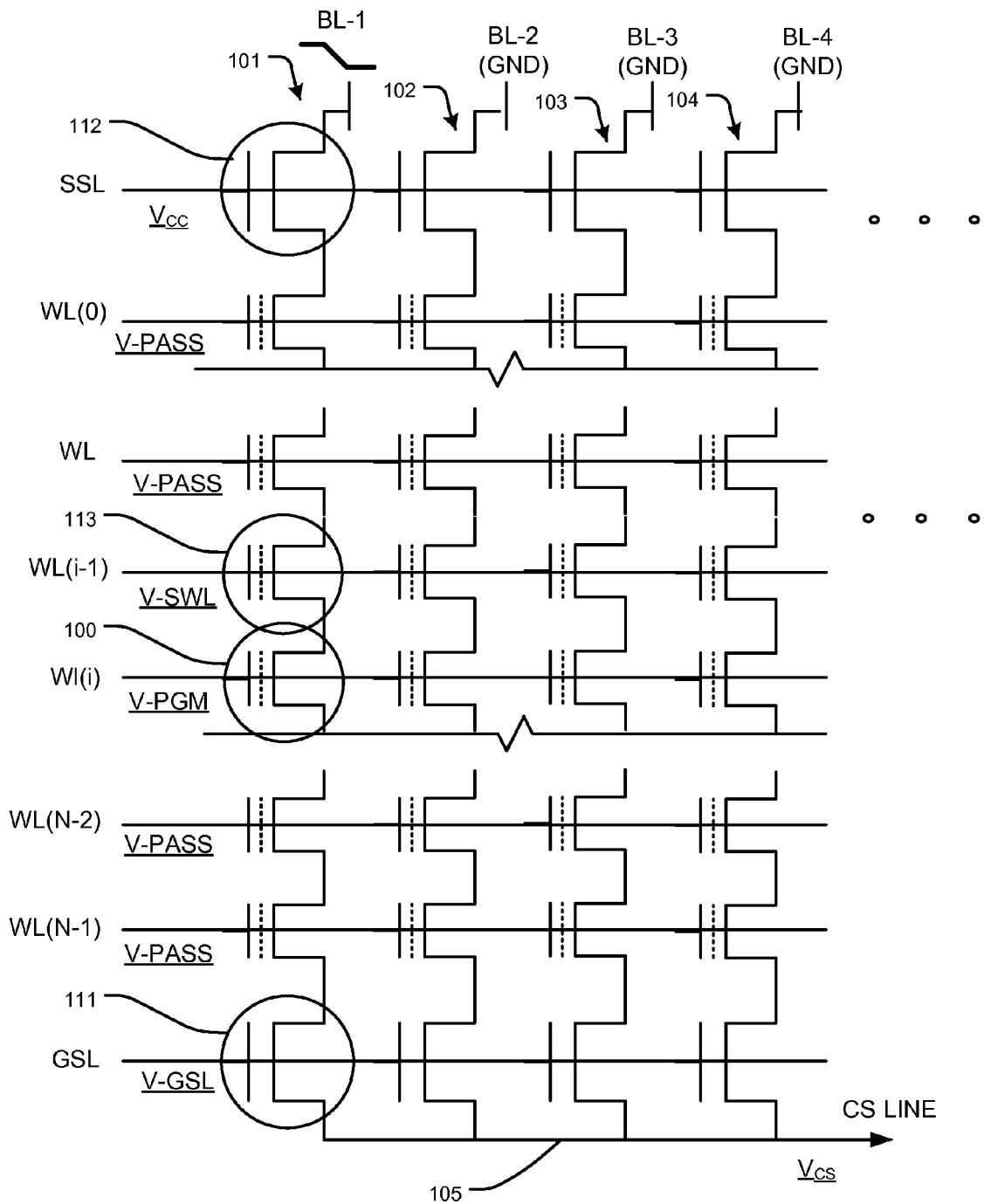
FIG. 4 is a schematic diagram of a common source type NAND-type memory array employing a program bias operation as described herein, with a first alternative bias for inhibiting disturb.

A detailed description of embodiments of the present invention is provided with reference to the FIGS. 1-10.

FIGS. 1A and 1B show in cross-section a plurality of dielectric charge trapping flash memory cells arranged in series to form a NAND string and biased for FN tunneling programming, as is typical in prior art NAND architecture flash memory. FIG. 1A shows the biasing for a NAND string that includes a target cell on a selected bit line, while FIG. 1B shows the biasing for a NAND string on an unselected bit line. One technology for implementation of NAND flash using bandgap engineered SONOS (BE-SONOS) charge trapping technology is described in U.S. Pat. No. 7,315,474 by Lue, which is incorporated by reference as if fully set forth herein. NAND strings can be implemented in a variety of configurations, including finFET technology, shallow trench isolation technology, vertical NAND technology and others. See, for an example vertical NAND structures, European Patent Application No. EP 2 048 709 by Kim et al. entitled "Non-volatile memory device, method of operating same and method of fabricating the same." A similar structure is used for floating gate memory cells, using conductive floating gates.

Referring to FIG. 1A, the memory cells are formed in a semiconductor body 10. For n-channel memory cells, the semiconductor body 10 can be an isolated p-well, within a deeper n-well in a semiconductor chip. Alternatively, the semiconductor body 10 can be isolated by an insulating layer or otherwise.

The plurality of flash memory cells is arranged in a string extending in a bit line direction, orthogonal to word lines. Word lines 22-27 extend across a number of parallel NAND strings. Terminals 12-18 are formed by n-type regions (for n-channel devices) in the semiconductor body 10, and act as the source/drain regions for the memory cells. A first switch formed by a MOS transistor (i.e., first switch transistor) having a gate in a ground select line GSL 21 is connected between the memory cell corresponding with first word line 22 and a contact 11 formed by an n-type region in the semiconductor body 10. The contact 11 is connected to common source CS line 30. A second switch formed by a MOS transistor (i.e., second switch transistor) having a gate in a string select line SSL 28 is connected between the memory cell corresponding to the last word line 27 and a contact 19 formed by an n-type region in the semiconductor body 10. The contact 19 is connected to a bit line BL 31. The first and second switches in the illustrated embodiment are MOS transistors, having gate dielectrics 7 and 8 formed by, for example, silicon dioxide.

In this illustration, there are six memory cells in the string for simplicity. In typical implementations, a NAND string may comprise 16, 32 or more memory cells arranged in series. The memory cells corresponding to the word lines 22-27 have charge trapping structures 9 between the word lines and channel regions in the semiconductor body 10. The charge trapping structures 9 in the memory cells can be dielectric charge trapping structures, floating gate charge trapping structures, or other flash memory structures suitable for programming using techniques described herein. Also, embodiments of NAND flash structures have been developed which are junction-free, where the terminals 13-17, and optionally terminals 12 and 18, may be omitted from the structure.

FIG. 1A shows the biasing according to a typical prior art technology to induce FN tunneling to program the memory cell corresponding with word line 24 (target cell). According to the biasing illustrated, the GSL is biased to about zero volts while the common source line is grounded, so that the first switch corresponding to the GSL line 21 is off, and the SSL is biased to about $V_{CC}$ while the selected bit line is grounded, so that the second switch corresponding to the SSL line 28 is on. In these conditions, the semiconductor body in the region 33 associated with the NAND string is pre-charged to about 0 Volts. The selected word line 24 is biased at a high voltage programming level V-PGM, which can be on the order of 20 volts in some embodiments. The unselected word lines 22, 23 and 25-27 are biased to a pass voltage V-PASS, which is less than V-PMG by an amount that inhibits programming in unselected memory cells in the string. As a result, electrons tunnel into the charge trapping structure of the selected memory cell.

FIG. 1B shows the biasing according to prior art technology at unselected bit lines for NAND strings which share the word lines 22-27 with the string shown in FIG. 1A. As can be seen, the GSL, the SSL and all of the word lines have the same bias voltages as shown in FIG. 1A. Likewise, the common source line 30 is grounded. However, the unselected bit line 32 is biased to a level about $V_{CC}$. This turns off the second switch, which corresponds with the SSL line, and decouples the semiconductor body in the region 35 from the unselected bit line BL 32. As a result, the semiconductor body in the region 35 is boosted by capacitive coupling from the voltages applied to the word lines 22-27, which prevents formation of electric fields sufficient to disturb the charge trapped in the memory cells in the unselected NAND string. So-called incremental step pulsed programming ISPP operations based on capacitive self-boosting are common in the art.

FIG. 2 shows programming bias for a selected NAND string, for hot carrier programming as has been attempted in the prior art.

In FIG. 2, the common source CS line 30 is grounded, and the selected bit line 31 is also coupled to $V_D$. The GSL line 21 is coupled to a pass voltage turning on the first switch 42, coupling the semiconductor body to the CS line 30. The SSL line 28 is coupled to a pass voltage, turning on the second switch transistor 43, and coupling the semiconductor body to the selected bit line 31, which is coupled to $V_D$, or a drain side, bit line program bias. The word line corresponding to the target memory cell 40 receives a program pulse at V-PGM. As a result of this biasing arrangement, a channel current $I_{PGM}$ flows in the semiconductor body for the string, which is fully on as shown by trace 55. Also, the drain to source voltage (see region 56) across the target cell is quite small, as the voltage drop from $V_D$ to ground is distributed along the string as shown by trace 57 in the $V_{CHANNEL}$ graph. As a result, the heating field in the target cell that corresponds to its drain to source voltage in the program interval is small, and hot carrier injection is slow and inefficient even though the channel current is relatively high. Thus, hot carrier injection has not been adopted to a significant degree for NAND programming.

FIG. 3 shows programming bias for hot carrier injection as described herein. It is noted that for n-channel embodiments, the hot carriers include electrons. For p-channel embodiments, similar bias techniques can be applied to induce hot hole injection, in which the hot carriers include holes. The program process is described with reference to the n-channel embodiment herein, but is referred to as hot carrier injection in reference to alternative p-channel embodiments.

The word line coupled with switching memory cell 41 adjacent the target memory cell 40 on the side of the common source CS line 30 receives a switching voltage V-SW which is arranged to cause conditions for efficient hot carrier injection during a portion of the program interval. Under the biasing condition during a program interval, the region 51 in the semiconductor body 10 is pre-charged by setting the common source voltage $V_{CS}$ to a drain side voltage $V_D$ in response to the pass voltages V-PASS (drain side) on the word lines between the target word line which receives V-PGM and the first switch 42. The region 50 in the semiconductor body 10 is biased during an initial portion of the program interval by capacitive boosting while the second switch transistor 43 is off, and then in a subsequent portion of the program interval applying a source side voltage via the bit line 31 and turning the second switch on. In this example, the biasing in the initial and subsequent portions of the program interval on the source side is accomplished by setting the gate voltage of the second switch to $V_{CC}$ during the program interval, and applying a varying voltage to the bit line BL 31. The varying voltage in this embodiment includes setting the bit line 31 voltage to about $V_{CC}$, or other voltage level that is less than a threshold for switch transistor 43 below $V_{CC}$, or higher than $V_{CC}$, in the initial portion of the program interval, during which the second switch transistor 43 is off, and the region 50 of the semiconductor body is boosted as a result of the pass voltages V-PASS applied to the source side cells. Then, in the subsequent portion of the program interval, the bit line 31 voltage is reduced to an effective source voltage $V_S$, below $V_D$ such as ground, which turns on the second switch transistor 43 while the voltage V-PASS (source side) is coupled to the word lines between the target memory cell 40 and the second switch transistor 43. V-PASS (source side) may be the same voltage as V-PASS (drain side), or may be different as suits a particular implementation or programming condition. Also, the pass voltages V-PASS may vary depending on the location in the string.

FIG. 3 includes a heuristic graph showing the voltage levels versus location along the string during the program interval. The voltage level in effective drain region 51 between the contact 11 of the first switch and the target memory cell 40, is set by the voltage $V_{CS}$ applied via the first switch from the common source line CS 30, set at about $V_D$ in this example during the program interval. The voltage level in the effective source region 50 between the contact 19 of the second switch transistor 43 and the switching memory cell 41 has level represented by trace 63A during the initial portion of the program interval (for reference, roughly to the left of line 65 in FIG. 3), as a result of the capacitive boosting. Little or no current flows during the initial portion of the program interval, because the second switch is off, and the voltage variation across the string is small. In the subsequent portion of the program interval (for reference, roughly to the right of line 65 in FIG. 3), the voltage level in the effective source region 50 has level represented by trace 63B, as a result of the drop in the voltage applied to the bit line 31, and the turning on of the second switch. During the subsequent portion of the program interval, a relatively large voltage drop occurs across the channel region 52 beneath the switching memory cell 41. The current in the semiconductor body increases to a program current level sufficient to efficiently support hot carrier injection, at a level represented by trace 62 between the fully-on channel current level 61 and the fully-off channel current level 60. Also, the voltage drop across the channel region 52 of the switching memory cell 41, as shown in region 64 of the $V_{CHANNEL}$ plot, absorbs most of the drop between the bit line voltage for programming and common source line voltage, creating heating fields in the vicinity of the target memory cell 40, that support hot carrier injection.

In this example, as in all example NAND strings shown herein, the first and second switches (e.g. switch transistors 42, 43) are implemented by field effect transistors in series with the memory cells in the string. One can utilize other switch circuits if desired. In the example shown in FIG. 3, the gate dielectrics for the field effect transistors are drawn as single layer structures, and typically comprise a layer of a silicon oxide or nitrogen doped silicon oxide. In other the implementations, the field effect transistor used for the switches (e.g. 42, 43) in example NAND strings shown herein, can have a multilayer gate dielectric, including a gate dielectric that is implemented in the same manner as the charge storage layers in the memory cells in the string. This approach can simplify the manufacturing process. In such embodiments, the first and second switches can be characterized as being "memory cells." The channel lengths of the field effect transistors used to implement the switches can be longer than the channel length in memory cells if desired. Because of relatively lower operating voltages, compared to Fowler-Nordheim tunneling, disturbance of memory cells in the array during programming of a target cell can be suppressed using techniques described herein. Also, because the word line voltage used for the programming method can be lower than that used in conventional NAND flash using Fowler-Nordheim tunneling-based memory devices, the vertical field across the tunnel oxide is smaller. For this reason, it is not necessary to use high-voltage driving devices, and reliability should be better. In addition, using floating gate devices, memory cells can be designed with a lower gate coupling ratio and improved program speeds are achieved using such low gate coupling ratio cells. Also, as a result of the use of lower voltage devices, the manufacturing processes can be simpler due to the elimination of very high-voltage support devices.

A method for inducing hot carrier injection in a target cell is based on application of a switching word line voltage to control conductance of a switching cell on the source side of the target cell during operation. The conductance is controlled so that cell current in the switching cell is sufficiently off that it can separate the NAND string into two regions, including an effective source region and an effective drain region. The voltage drops in the effective source region and effective drain region are very small. As a result, the applied bit line voltage occurs mostly across the switching cell. Also, the conductance is sufficiently on that a small but sufficient amount of current can flow through the switching cell and target cell, where the carriers are heated and injected into the charge trapping structure in the target cell.

The voltage across the selected bit line and the common source line should be high enough to induce hot carrier heating fields in target cells, during the portion of the program interval in which the current is enabled in the string. The voltage applied to the ground select line and string select line needs to be high enough to fully pass the drain side and source side voltages. The voltage applied on the ground select line and string select line can be different. Likewise, the voltage applied on the unselected word lines should be high enough to fully pass the applied voltage on the bit lines and common source line. It is noted that the pass voltages on the effective drain side and the pass voltages on the effective source side can be different. Likewise, they can be varied along the length of the string if desired. For the target word line which corresponds with the cell to be programmed, the program voltage applied should be high enough to cause electron injection. The voltage on the switching word line has to lie within an operative range during the programming making the drain to source voltage and the program current at the target memory cell high enough for hot carrier injection. This range can be determined empirically by experimentation or simulation techniques with a particular implementation.

FIG. 4 is a circuit diagram showing layout of four NAND strings 101, 102, 103, 104 coupled to respective bit lines BL-1 to BL-4 and to a common source CS line 105 by string select transistors (e.g. 112) and ground select transistors (e.g. 111), respectively. For the purpose of illustration, the bias voltages are shown for programming a target memory cell 100 on corresponding word line WL(i) in the NAND string 101. The first switch transistor 111 is biased by a ground select line pass voltage such as V-GSL on the GSL line to pre-charge the effective drain side of the NAND string via the CS line 105 to a drain side voltage. The second switch transistor 112 is biased with a gate voltage of about $V_{CC}$ in this example, while the bit line voltage is biased in initial and subsequent portions of the program interval as described above. A switching memory cell 113 on a corresponding word line WL(i−1) is adjacent the target memory cell 100. Thus, the word line WL(i−1) receives V-SW during the program interval.

Alternative biasing arrangements and array configurations are also possible. The representative implementation shown in FIG. 4 involves biasing so that the current flow in the NAND string is from the selected bit line (low voltage) to the common source line (higher voltage). In alternatives, the effective source and effective drain side biasing can be reversed.

According to one technique for inhibiting disturbance of unselected cells, the unselected bit lines are set to a bit line voltage at or near ground, so that current flow in the unselected bit lines is limited and insufficient for programming the cell sharing the word line WL(i) with the target cell. Note that when a target memory cell is on the first word line WL(0), the string select line SSL can be used to apply a switching voltage V-SW, which may be optimized for operation using the switch transistor 112 rather than a memory cell. Alternatively, a dummy word line, as shown below can be disposed between the WL(0) and the switch transistor 112.

Figure 5:
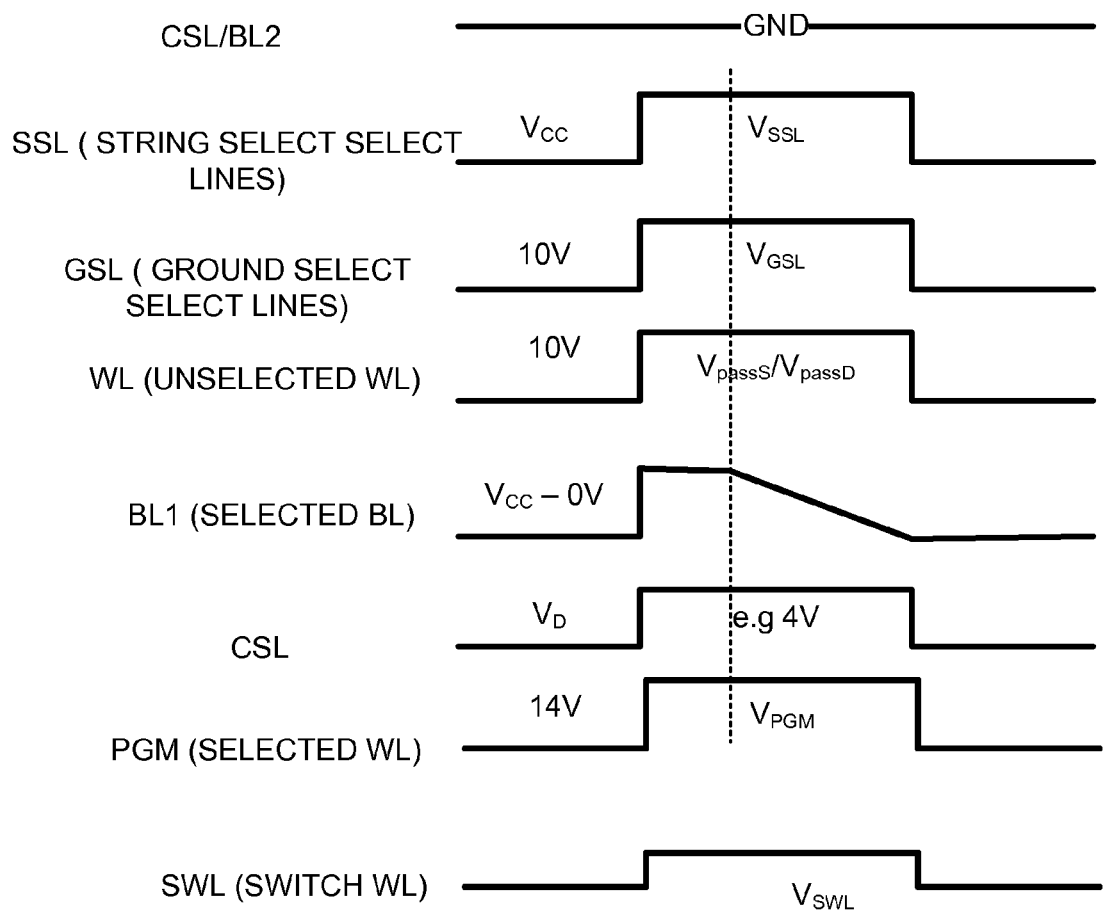
FIG. 5 is a simplified timing diagram for word line and bit line voltages for a hot carrier program operation as described herein.

FIG. 5 is a timing diagram for one example of the bias voltages in connection with the operation described with reference to FIG. 4. Unselected bit lines (e.g. BL-2) are biased at ground throughout the interval. The ground select word line GSL is coupled to about 10 V, throughout the interval. Also, unselected word lines on both the effective source and effective drain sides are coupled to a pass voltage of 10 V in this example. The source select word line SSL is coupled to a voltage such as $V_{CC}$ throughout the interval. The selected bit line BL-1 is coupled to a voltage level at or near the $V_{CC}$ (i.e. the level of the SSL word line) during an initial portion of the program interval (left of line 500), and then ramped to about ground during a subsequent portion of the program interval (i.e. right of line 500). The selected word line receives a program pulse of about 14 V in this example for a program interval. V-SW is set to a level provides for sufficient current flow, while maintaining a heating field.

When the voltage level of the bit line falls enough to cause the SSL switch to turn on, current begins to flow in the NAND string and then it reaches a level that is modulated by the voltage V-SWL applied to the switching memory cell, and that is sufficient to induce hot carrier injection.

For reference, representative bias levels for erase operations are shown in the following table.

|  | Erase |
| --- | --- |
| Unselected WL | -8 V |
| Selected WL | -8 V |
| Switch WL | -8 V |
| Unselected BL | Floating |
| Selected BL | Floating |
| PW | 12 V |
| SSL | Floating |
| GSL | Floating |
| Common Source | Floating |

Figure 6:
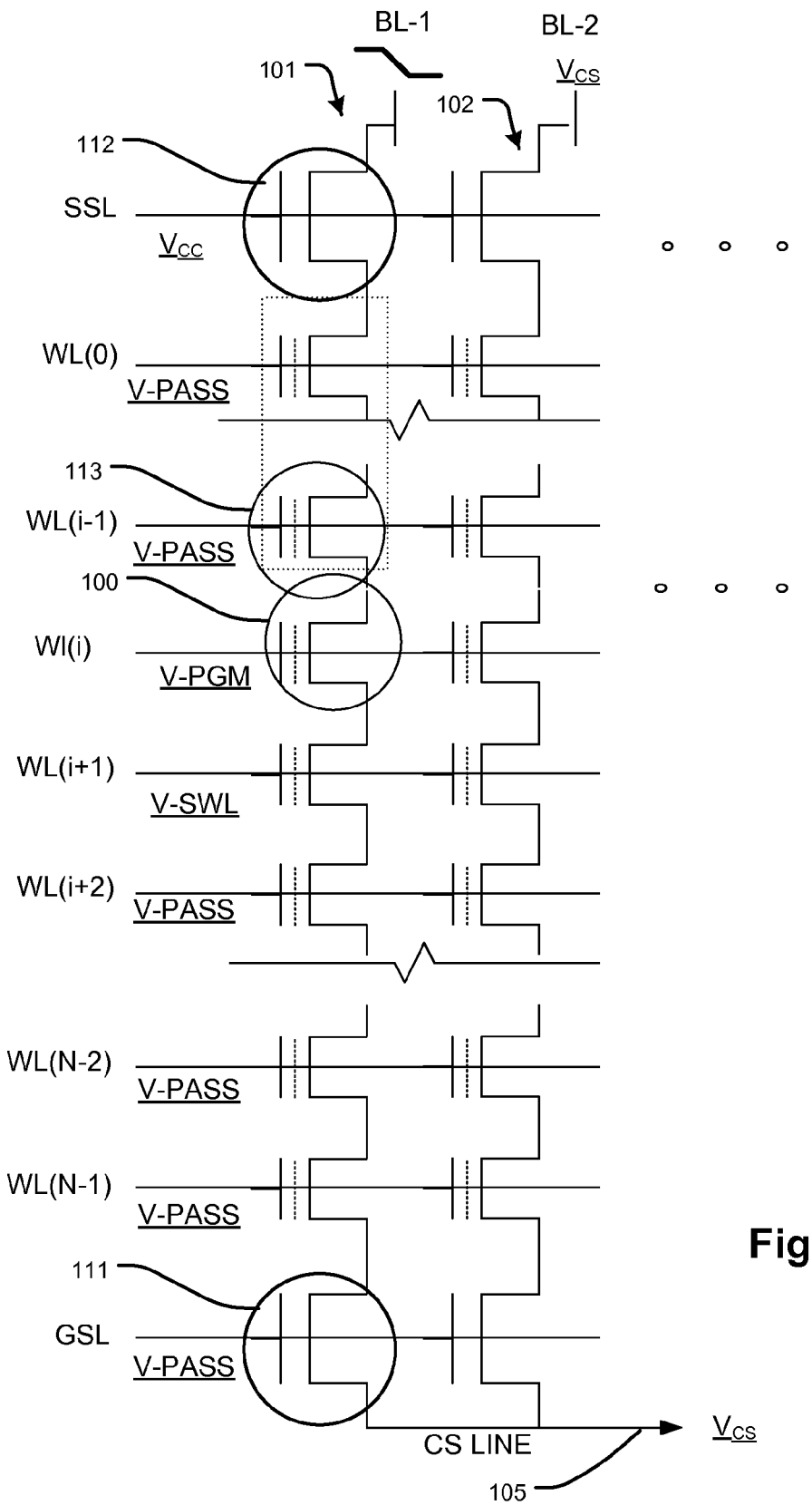
FIG. 6 is a schematic diagram of a common source type NAND-type memory array employing a program bias operation as described herein according to a second alternative configuration for inhibiting disturb.

FIG. 6 shows the bias conditions for a second alternative technique for inhibiting disturbance of cells on unselected strings. Thus, FIG. 6 is a circuit diagram showing layout of two NAND strings 101, 102 which are coupled to respective bit lines BL-1 to BL-2 and to a common source CS line 105 by string select transistors and ground select transistors, respectively. The bias voltages are shown for programming a target memory cell 100 on a corresponding word line WL(i) in the NAND string 101. The first switch transistor 111 is biased to couple the NAND string to the CS line 105 biased with a drain side voltage level ($V_{CS}$ is set to $V_D$). The second switch transistor 112 is biased by VCC on the SSL line and the two stage voltage on the selected bit line BL-1 to couple the top of the NAND string to the selected bit line BL-1. The switching memory cell 113 on word line WL(i-1) is adjacent the target memory cell 100 on the effective source side. Thus, the word line WL(i-1) receives V-SW supporting the hot carrier injection program interval. The unselected bit lines are coupled to $V_{CS}$ which can be lower than $V_{CC}$, so that the effective drain and effective source regions are biased to a common voltage via unselected bit lines BL-2 and the CS line 105.

Figure 7:
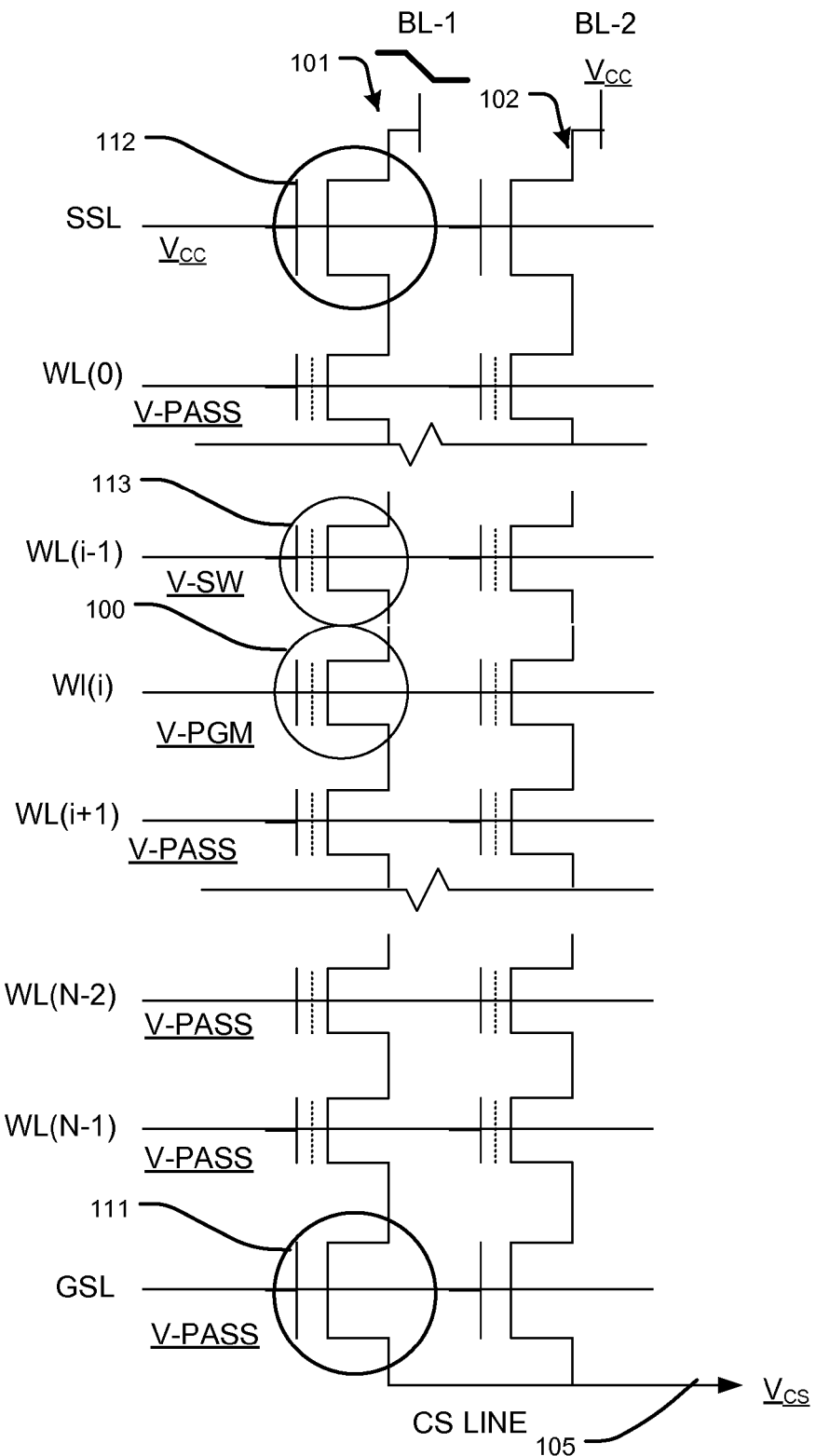
FIG. 7 is a schematic diagram of a common source type NAND-type memory array employing a program bias operation as described herein according to a third alternative configuration for inhibiting disturb.

FIG. 7 illustrates bias conditions for a third alternative technique for inhibiting disturbance of cells on unselected strings. The target memory cell corresponding with word line WL(i) receives the program potential. The switching voltage is applied to the word line WL(i-1) on the bit line side of the NAND string. The bias voltage from the selected bit line in the second portion of the program interval at ground potential is used to establish an effective source region in the NAND string between the string select switch (e.g., switch transistor 112) and the target memory cell 100. The switching memory cell 113 receives the switching voltage which meters the conductance of the switching cell to create the hot carrier injection conditions described above. The unselected bit lines receive a supply potential such as $V_{CC}$, which remains constant during the programming interval preventing current flow, and causing self boosting of the effective source side of the NAND string, thereby inhibiting disturbance in the unselected string.

When the target cell for programming is the first memory cell in the NAND string, next to the ground select line, there is no memory cell adjacent the target memory cell on the effective source side that can be used as the switching cell. Conversely, when the target cell for programming is the last memory cell in the NAND string, next to the string select line, and the string is biased to make the effective source at the top, then again, there is no memory cell adjacent the target memory cell on the effective source side that can be used as the switching cell. In these cases, the string select line or ground select line can be utilized to control the conductance of the semiconductor body in the manner of a memory cell, with suitable applied voltage. In an alternative, dummy word lines can be utilized.

Figure 8:
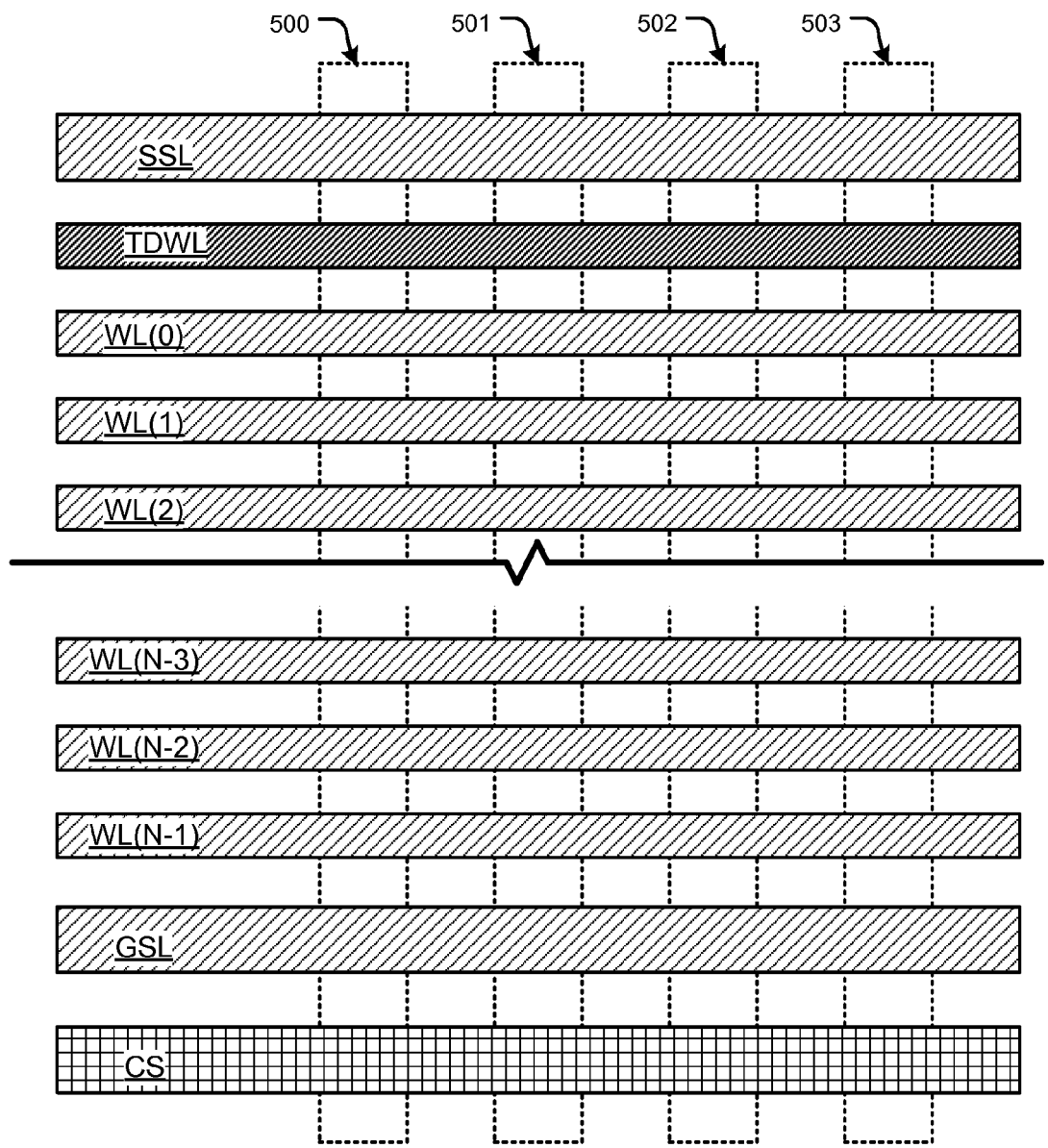
FIG. 8 is a simplified layout view of a NAND array showing a configuration having a dummy word line.

FIG. 8 shows a simplified layout view showing the word lines and source-drain strings of a NAND array like that of FIG. 3 with, in addition, a top dummy word line TDWL adjacent the SSL line. As shown, source-drain strings 500-503 extend vertically on the page. Horizontal conductor lines overlie the source-drain strings 500-503. The horizontal conductor lines include the SSL line, top dummy word line TDWL, and word lines WL(0) to WL(N-1). Also, the horizontal conductor lines include the GSL line in the common source CS conductor. The dummy word line on the top of the string can be used for controlling a dummy memory cell, during hot carrier injection programming as described above.

Figure 9:
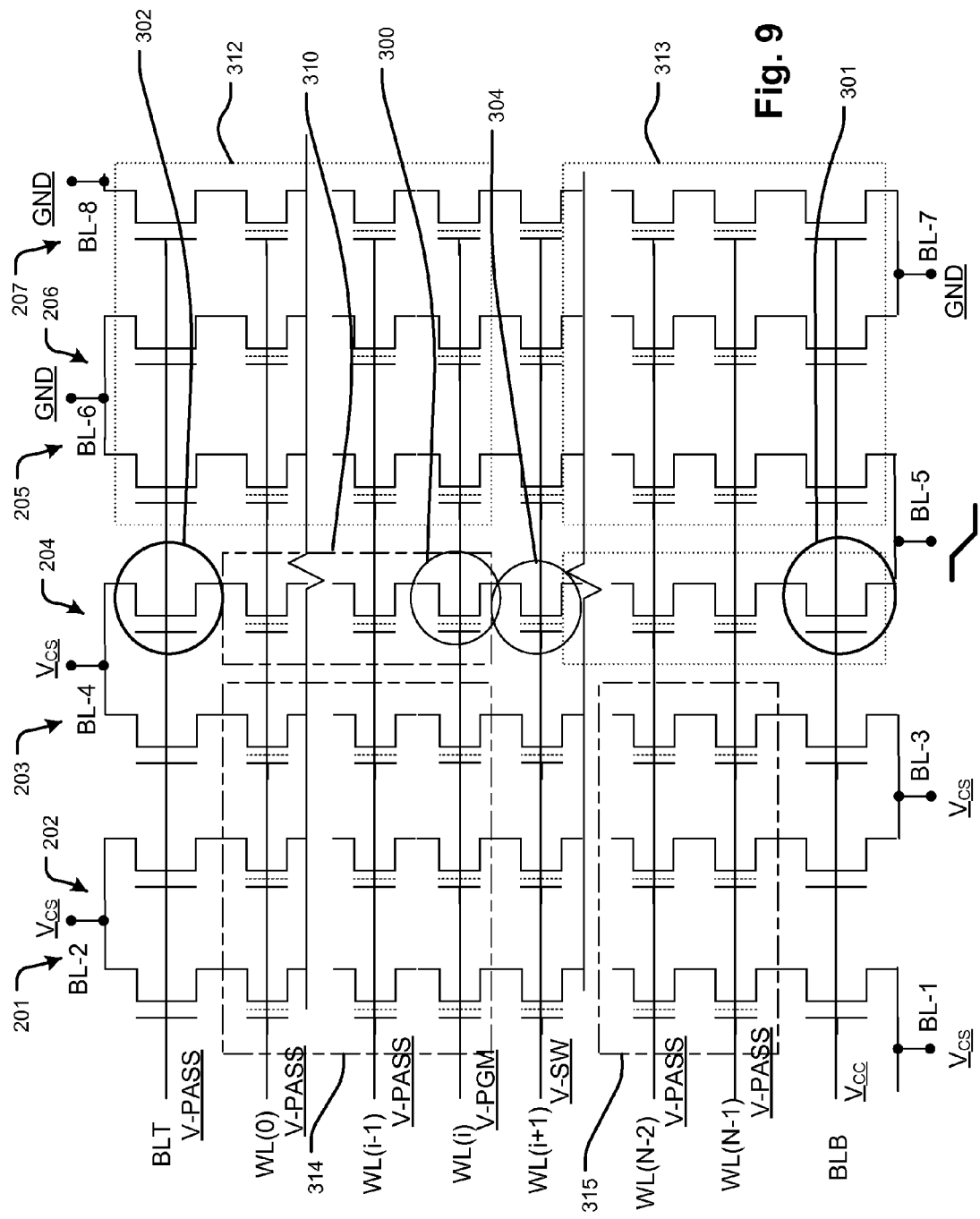
FIG. 9 is a schematic diagram of a virtual ground NAND-type memory array employing a program bias operation as described herein.

FIG. 9 is a circuit diagram showing layout of seven NAND strings 201-207 arranged in a virtual ground NAND architecture. In a virtual ground architecture as described here, the bit lines act as both bit lines coupled to sense amplifiers and reference lines coupled to reference voltage sources, depending on the column being accessed. The NAND strings are coupled to corresponding pairs of bit lines BL-1 to BL-8 by top bit line select transistors BLT and bottom bit line select transistors BLB. For the purpose of illustration, the bias voltages are shown for programming a target memory cell 300 on corresponding word line WL(i) in the NAND string 204. The first switch transistor 301 is biased by $V_{CC}$ on the BLB line to enable the two stage operation with the two stage bit line voltage applied via BL-5 to the NAND string 204. The second switch transistor 302 is biased by V-PASS on the BLT line to couple the NAND string 204 to the bit line BL-4, which is biased at the level of the common source voltage $V_{CS}$ (i.e. a drain side voltage $V_D$) described above. All of the bit lines BL-1 to BL-3 to the left of target NAND string 204, are biased at $V_{CS}$. All of the bit lines BL-6 to BL-8 to the right of the target NAND string 204 are biased at ground. A switching memory cell 304 on corresponding word line WL(i+1) is adjacent the target memory cell 300. Thus, the word line WL(i+1) receives the V-SW. The semiconductor body in the region 310 is biased to the effective drain voltage (e.g. $V_{CS}$ as used in the embodiments of FIGS. 4, 6 and 7), thereby setting up the effective drain region in NAND string 204. On the unselected strings to the right, the effective drain and source regions 312 and 313 are biased to ground potential via the bit lines BL-5 to BL-8 to avoid disturbance of memory cells in those strings. On the unselected strings to the left, the regions 314 and 315 are coupled to a relatively high voltage such as $V_{CS}$ on the bit lines BL-1, BL-2, BL-3, to avoid disturbance of memory cells in those strings. Thus, when the switching memory cell 304 receives a switch voltage, and the bit line voltage on bit line BL-5 falls in the portion of the programming interval enabling hot carrier injection, the target memory cell 300 is programmed by hot carrier injection, while the other memory cells in the array are not disturbed.

Figure 10:
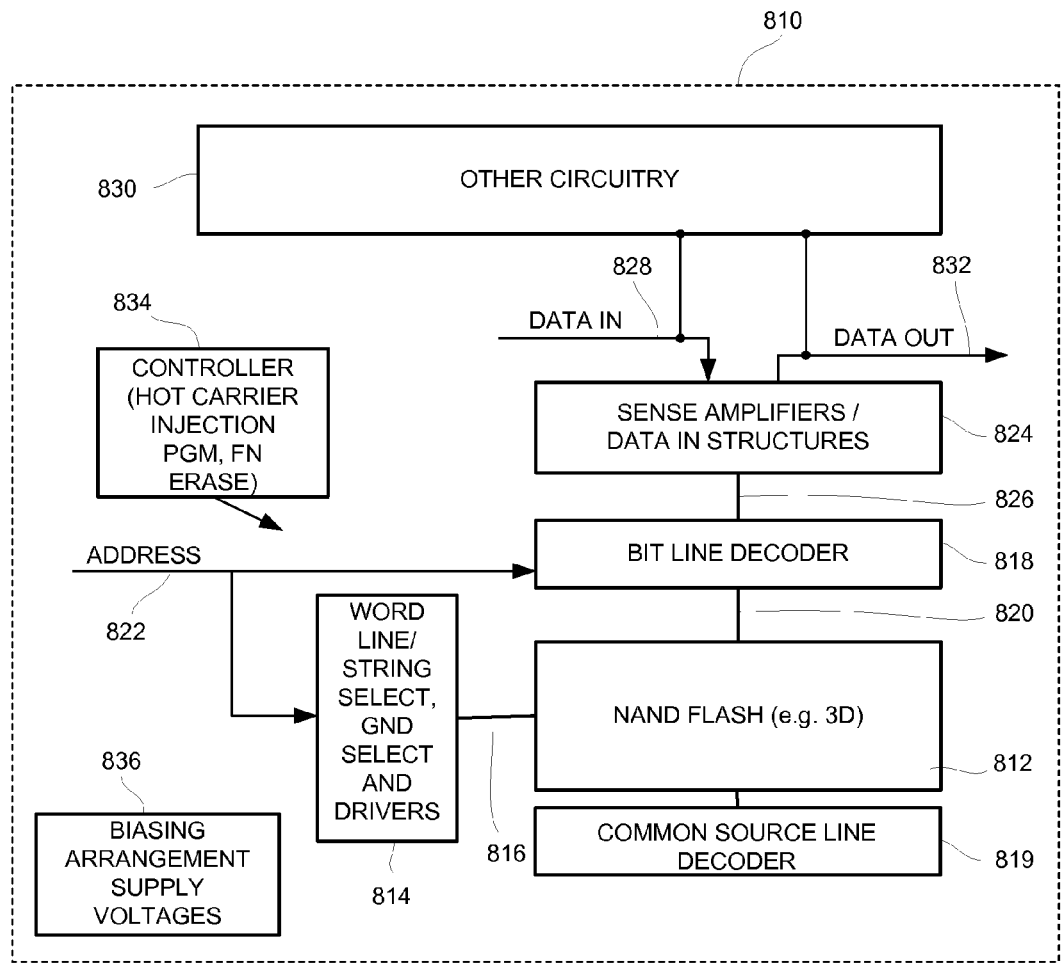
FIG. 10 is a block diagram of an integrated circuit memory employing memory cells and bias circuitry according to embodiments of the present invention.

FIG. 10 is a simplified block diagram of an integrated circuit employing hot carrier injection programmed NAND flash as described herein. The integrated circuit 810 includes a memory array 812 implemented using charge trapping memory cells or floating gate memory cells, for example, on a semiconductor substrate. A word line (or row), ground select and string select decoder 814 (including appropriate drivers) are coupled to, and in electrical communication with, a plurality 816 of word lines, string select lines and ground select lines, arranged along rows in the memory array 812. A bit line (column) decoder and drivers 818 are coupled to and in electrical communication with a plurality of bit lines 820 arranged along columns in the memory array 812 for reading data from, and writing data to, the memory cells in the memory array 812. Optionally, a common source line decoder 819 is provided to support shared word line and shared bit line arrangements, such as can occur in 3D memory architectures. Addresses are supplied on bus 822 to the word line decoder and string select decoder 814 and to the bit line decoder 818. Sense amplifiers and data-in structures in block 824, including current sources for the read, program and erase modes, are coupled to the bit line decoder 818 via data bus 826. Data is supplied via the data-in line 828 from input/output ports on the integrated circuit 810 or from other data sources internal or external to the integrated circuit 810, to the data-in structures in block 824. In the illustrated embodiment, other circuitry 830 is included on the integrated circuit 810, such as a general purpose processor or special purpose application circuitry, or a combination of modules providing system-on-a-chip functionality supported by the memory cell array. Data is supplied via the data-out line 832 from the sense amplifiers in block 824 to input/output ports on the integrated circuit 810, or to other data destinations internal or external to the integrated circuit 810.

A controller 834 implemented in this example, using a bias arrangement state machine, controls the application of bias arrangement supply voltages and current sources 836, such as read, program, erase, erase verify, program verify voltages or currents for the word lines and bit lines, and controls the word line/source line operation using an access control process. The controller implements the switching sequences used to induce hot carrier programming as described herein. The controller 834 can be implemented using special purpose logic circuitry as known in the art. In alternative embodiments, the controller 834 comprises a general purpose processor, which may be implemented on the same integrated circuit, which executes a computer program to control the operations of the device. In yet other embodiments, a combination of special-purpose logic circuitry and a general-purpose processor may be utilized for implementation of the controller 834. The controller 834 can be configured to implement a method for inducing hot carrier injection in a selected cell in a NAND string in a NAND array, comprising:

controlling conductance in the NAND string by applying a switching voltage to a word line adjacent the selected word line to induce an effective source in a first semiconductor body region on one side of a selected cell and to induce an effective drain in a second semiconductor body region on another side of the selected cell in the NAND string;

floating the first semiconductor body during an initial portion of a program interval and biasing the first semiconductor body region to a source side voltage during a subsequent portion of the program interval;

biasing the second semiconductor body region to a drain side voltage; and applying a program potential greater than a hot carrier injection barrier level to the selected cell during the program interval.

The controller 834 can be configured to implement a biasing operation to prevent program disturb by turning off one of the first and second switches in at least one unselected NAND string. Also, the controller 834 can be configured to implement a biasing operation to prevent program disturb by turning on the first and second switches in at least one unselected NAND string.

In the above cross-referenced applications, which are incorporated by reference as if fully set forth herein, additional biasing approaches are described for hot carrier injection operation of NAND strings, based on the use of switching memory cells and modulation of channel current. Some approaches may use self-boosting to build up the effective source and drain voltages. Some approaches may use directly forced source and drain side voltages. Some approaches may use a dynamic, or swept, voltage V-SW applied to the switching memory cell.

The programming method described here can be applied to conventional NAND arrays using common source architectures, and modified NAND arrays with a virtual ground type architecture. For each array type, programming can be accomplished with current flow in first and second directions. According to the first current flow direction, the effective drain is located on the upper part of the NAND string, and the effective source is located on the lower part. For the second current flow direction, the effective source is located on the upper part of the NAND string while the effective drain is located on the lower part.

A new programming method for NAND flash is provided which suppresses program disturb due to lower operation voltages. A new program based on use of switching potentials to achieve hot carrier injection enables use of reduced operation voltage. As a result of reduced operation voltages, the driving circuitry on the integrated circuit can be implemented using only one MOSFET process, without requiring additional high voltage MOSFET processes.

Also, the WL voltage of this program method can be lower than that required for conventional NAND flash FN programming operation. Thus, very high voltage driving devices are not needed. Also, the vertical electric field across the tunnel oxide in the NAND flash array is smaller than that required for FN injection. As a result of lower E-field requirements, device reliability is better.

Furthermore, lower program and VPASS voltages than required for conventional FN operation cause reduced inter-WL dielectric voltages, and thus mitigate inter-WL dielectric breakdown issues that arise as the spacing between word lines shrinks While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory comprising:
a plurality of memory cells arranged in series in a semiconductor body;

a plurality of word lines, word lines in the plurality coupled to corresponding memory cells in the plurality of memory cells; and control circuitry coupled to the plurality of word lines adapted for programming a selected memory cell in the plurality of memory cells corresponding to a selected word line by:

applying a switching voltage to a word line and corresponding memory cell other than the selected word line and selected memory cell, the switching voltage having a first voltage level during a first time interval which blocks current flow through the corresponding memory cell, and thereafter changing to a second voltage level to enable current flow through the corresponding memory cell during a second time interval;

during the first time interval, biasing one of first and second ends of the plurality of memory cells to a drain side voltage, while floating another of the first and second ends;

during the first time interval, applying drain-side pass voltages to word lines between the selected word line and said one of first and second ends;

during the first time interval, applying source-side pass voltages to word lines between the selected word line and said other of first and second ends;

during the second time interval, applying a program voltage to the selected word line and connecting said other of the first and second ends to a source side voltage inducing current flow through the plurality of memory cells, and causing hot carrier injection in the selected memory cell.

2. The memory of claim 1, wherein said source side voltage ramps down during the second time interval.

3. The memory of claim 1, including a first switch transistor between a reference line and the first end of the plurality of memory cells and a second switch transistor (SSL) between a first bit line and the second end of the plurality of memory cells, and wherein said floating another of the first and second ends to a source side voltage comprises setting the source side voltage to an initial level that is less than a threshold below, or above, a gate voltage applied to the corresponding one of the first and second switch transistors, so that the corresponding switch transistor remains off during the first time interval, and said connecting said other end including ramping the source side voltage down from the initial level to a level or levels more than the threshold voltage below the gate voltage so that the corresponding switch transistor turns on during the second time interval.

4. The memory of claim 1, wherein the plurality of memory cells is arranged as a NAND string.

5. The memory of claim 1, including a first switch transistor between a reference line and the first end of the plurality of memory cells and a second switch transistor between a first bit line and the second end of the plurality of memory cells, and wherein the control circuitry turns on the first switch transistor during the first time interval, and turns on the second switch transistor after the first time interval.

6. The memory of claim 5, including a second plurality of memory cells coupled to the plurality of word lines, and wherein the control circuitry applies the source side voltage via said first bit line to the second end of the plurality of memory cells, applies the drain side voltage via the reference line to the first end of the plurality of memory cells, and applies a voltage equal to or near ground during at least the first time interval via the second bit line to the second end of the second plurality of memory cells to inhibit hot carrier injection.

7. The memory of claim 5, including a second plurality of memory cells coupled to the plurality of word lines, and wherein the control circuitry applies the source side voltage via said first bit line to the second end of the plurality of memory cells, applies the drain side voltage via the reference line to the first end of the plurality of memory cells, and applies a voltage equal to or near the drain side voltage via the second bit line to the second end of the second plurality of memory cells to inhibit hot carrier injection.

8. The memory of claim 1, including:

a first switch transistor between a reference line and the first end of the plurality of memory cells and a second switch transistor between a first bit line and the second end of the plurality of memory cells, and a second plurality of memory cells coupled to the plurality of word lines, a corresponding first switch transistor between said reference line and a first end of the second plurality of memory cells and a corresponding second switch transistor between a second bit line and a second end of the second plurality of memory cells;

wherein said floating another of the first and second ends comprises setting the source side voltage to an initial level that is less than a threshold below, or above, a gate voltage applied to the corresponding one of the first and second switch transistors, so that the corresponding switch transistor remains off during the first time interval, and said connecting said other end including ramping the source side voltage down from the initial level during the second time interval to a level or levels more than the threshold voltage below the gate voltage so that the corresponding switch transistor turns on during the second time interval; and wherein the control circuitry applies a voltage at or near said initial level during the second time interval via the second bit line to the second end of the second plurality of memory cells to inhibit hot carrier injection.

9. The memory of claim 1, including a second plurality of memory cells coupled to the plurality of word lines and a second bit line, and wherein the control circuitry inhibits hot carrier injection in the second plurality of memory cells.

10. The memory of claim 1, wherein the plurality of memory cells is arranged as a NAND string in a common source NAND flash memory array.

11. The memory of claim 1, wherein the plurality of memory cells is arranged as a NAND string in a virtual ground NAND flash memory array.

12. A memory comprising:

a NAND string including a plurality of memory cells arranged in series in a semiconductor body;

a plurality of word lines, word lines in the plurality coupled to corresponding memory cells in the plurality of memory cells; and control circuitry coupled to the plurality of word lines adapted for programming a selected memory cell in the plurality of memory cells corresponding to a selected word line by:

controlling conductance in the NAND string by applying a switching voltage to a word line adjacent the selected word line to induce an effective source in a first semiconductor body region on one side of a selected cell and to induce an effective drain in a second semiconductor body region on another side of the selected cell in the NAND string;

floating the first semiconductor body region during an initial portion of a program interval;

biasing the second semiconductor body region to a drain side voltage; and applying a program potential greater than a hot carrier injection barrier level to the selected cell during the program interval;

changing the switching voltage during a subsequent portion of the program interval to enable current flow between the first and second semiconductor body region; and after changing the switching voltage, biasing the first semiconductor body region to a source side voltage.

13. A method for inducing hot carrier injection in a selected cell in a NAND string in a NAND array, comprising:

controlling conductance in the NAND string by applying a switching voltage to a word line adjacent the selected word line to induce an effective source in a first semiconductor body region on one side of a selected cell and to induce an effective drain in a second semiconductor body region on another side of the selected cell in the NAND string;

floating the first semiconductor body region during an initial portion of a program interval;

biasing the second semiconductor body region to a drain side voltage during the program interval; and applying a program potential greater than a hot carrier injection barrier level to the selected cell during the program interval;

changing the switching voltage during a subsequent portion of the program interval to enable current flow between the first and second semiconductor body region; and after changing the switching voltage, biasing the first semiconductor body region to a source side voltage.

14. The method of claim 13, wherein NAND strings in the NAND array include a first switch transistor between a first end of the NAND string and a bit line or reference line and a second switch transistor between a second end of the NAND string and a bit line or reference line, and wherein:

said biasing the second semiconductor body region to a drain side voltage includes turning on the first switch transistor in the NAND string including the selected cell and applying the drain side voltage to the first end of the NAND string via the first switch transistor;

said floating the first semiconductor region includes holding the second switch transistor off by setting the corresponding bit line or reference line to an initial voltage and setting a gate voltage to the second switch transistor so that the second switch transistor is off during the initial portion of the program interval; and said biasing the first semiconductor region includes applying a reduced voltage to the corresponding bit line or reference line so that the second switch transistor is on during the subsequent portion of the program interval.

15. The method of claim 13, including inhibiting hot carrier injection in at least one unselected NAND string.

16. A memory comprising:

a NAND string including a plurality of memory cells arranged in series in a semiconductor body;

a plurality of word lines, word lines in the plurality coupled to corresponding memory cells in the plurality of memory cells; and control circuitry coupled to the plurality of word lines adapted for programming a selected memory cell in the plurality of memory cells corresponding to a selected word line by:

blocking flow of carriers between a first semiconductor body region on a first side of a selected cell in the NAND string and a second semiconductor body region on a second side of the selected cell in the NAND string by applying a bias voltage to turn off a memory cell in the plurality of memory cells;

boosting by capacitive coupling the first semiconductor body region to a boosted voltage level;

biasing the second semiconductor body region to a drain side voltage level;

applying a program potential greater than a hot carrier injection barrier level to the selected cell; and enabling flow of carriers from the second semiconductor body region to the selected cell to cause generation of hot carriers, by changing the bias voltage to a turn on level on the memory cell, and thereafter coupling the first semiconductor body region to a source side voltage.

17. A method for inducing hot carrier injection in a selected cell in a NAND string in a NAND array, comprising:

blocking flow of carriers between a first semiconductor body region on a first side of a selected cell in the NAND string and a second semiconductor body region on a second side of the selected cell in the NAND string by applying a bias voltage to turn off a memory cell in the plurality of memory cells;

boosting by capacitive coupling the first semiconductor body region to a boosted voltage level during an initial portion of a program interval;

biasing the second semiconductor body region to a drain side voltage level;

applying a program potential greater than a hot carrier injection barrier level to the selected cell during the program interval; and enabling flow of carriers from the second semiconductor body region to the selected cell to cause generation of hot carriers, by changing the bias voltage to a turn on level on the memory cell, and thereafter coupling the first semiconductor body region to a source side voltage during a subsequent portion of the program interval.

18. The method of claim 17, including applying a switching voltage to a cell in the NAND string adjacent the selected cell.

19. The method of claim 17, wherein NAND strings in the NAND array include a first switch between a first end of the NAND string and a bit line or reference line and a second switch between a second end of the NAND string and a bit line or reference line, and wherein said boosting includes:

turning off the first switch in a NAND string including the selected cell to isolate the first semiconductor body region and applying a pass voltage to word lines coupled to the NAND string on the first side of the selected cell, while turning on the second switch and applying the drain side voltage to the second semiconductor body region via the second switch; and wherein said coupling the first semiconductor body region to a source side voltage includes turning on said first switch.

20. The method of claim 19, wherein the first switch comprises a switch transistor, and including applying a gate voltage to a gate of the switch transistor and setting the source side voltage to an initial level that is less than a threshold below, or above, the gate voltage applied to the switch transistor, so that the corresponding switch transistor remains off during the initial portion of the program interval, and ramps the source side voltage down from the initial level during the subsequent portion of the program interval to a level or levels more than the threshold voltage below the gate voltage.

21. The method of claim 17, including inhibiting programming in unselected NAND strings.

* * * * *